United States Patent [19]

Neilson et al.

[11] Patent Number: 4,631,564
[45] Date of Patent: Dec. 23, 1986

[54] GATE SHIELD STRUCTURE FOR POWER MOS DEVICE

[75] Inventors: John M. S. Neilson, Lower Providence Township, Montgomery County; Carl F. Wheatley, Jr., Butler Township, Luzerne County, both of Pa.; Norbert W. Brackelmanns, Randolph Township, Morris County, N.J.

[73] Assignee: RCA Corporation, Princeton, N.J.

[21] Appl. No.: 664,027

[22] Filed: Oct. 23, 1984

[51] Int. Cl.⁴ .............................. H01L 29/78
[52] U.S. Cl. ..................... 357/23.4; 357/20; 357/23.8; 357/23.14; 357/38; 357/52; 357/86
[58] Field of Search ............. 357/23.4, 23.8, 52, 357/20, 86, 38, 23.14

[56] References Cited

U.S. PATENT DOCUMENTS 4,364,073 12/1982 Becke et al. ..................... 357/23
4,412,242 10/1983 Herman et al. .................. 357/52
4,532,534 7/1985 Ford et al. ..................... 357/23.8

FOREIGN PATENT DOCUMENTS 2137811A 10/1984 United Kingdom ............. 357/23.8

Primary Examiner—Joseph E. Clawson, Jr.
Attorney, Agent, or Firm—Birgit E. Morris; Donald S. Cohen; Kenneth R. Glick

[57] ABSTRACT

A VDMOS device comprises a semiconductor wafer having a major surface with a first conductivity type drain region thereat. An array of second conductivity type body regions, spaced from each other by distance D, is diffused into the drain region from the first surface. The body regions each include a relatively high conductivity supplementary body region and a first conductivity type source region diffused therein from within the first surface boundary thereof. The spacing between each source region and the drain region defines a channel region at the first surface. A source electrode contacts the source and body regions and an insulated gate electrode overlies each channel region. A gate bond pad, in direct contact with the gate electrode, overlies a second conductivity type gate shield region and is insulated therefrom. The gate shield region is contiguous with the drain region and is spaced from the neighboring channel regions by distance D. The gate shield region includes a plurality of contact areas proximate to the periphery thereof and a plurality of relatively low conductivity portions disposed between the contact areas and the drain region. The source electrode ohmically contacts these contact areas.

7 Claims, 5 Drawing Figures

GATE SHIELD STRUCTURE FOR POWER MOS DEVICE

The present invention relates to field effect transistors (FETs) such as vertical metal oxide semiconductor FETs (MOSFETs). More particularly, the invention relates to vertical double-diffused MOSFET (VDMOS) devices such as conductivity modulated FETs (COMFETs) wherein source and gate electrodes are disposed on a major surface of the semiconductor wafer, a drain electrode is disposed on an opposing major surface, and wherein a gate bond pad must be isolated from a high voltage semiconductor region.

BACKGROUND OF THE INVENTION

A VDMOS device, as the term implies, is a MOSFET wherein two or more of the semiconductor regions are formed by diffusion. The device is described as being vertical in that source and drain electrodes are on opposite wafer surfaces so as to yield, during device operation, a current flow which is substantially perpendicular to the wafer surfaces. A gate electrode and the bond pad associated therewith is typically provided on the same wafer surface as the course electrode.

VDMOS devices are typically used in power switching applications wherein the source electrode is at ground potential, the drain electrode is biased between perhaps 50 and 2,000 volts and the gate electrode is biased between approximately 0 and 10 volts. External electrical contact to the gate electrode is made via a gate bond pad which is in direct contact with the gate electrode. In a typical device configuration, the gate bond pad is rectangular in shape and overlies a portion of the drain region. Frequently, the gate bond pad also incorporates relatively long, narrow extensions known as runners, so as to more uniformly distribute the gate voltage over the surface area of the gate electrode. In that the drain region is typically at the drain electrode potential, some means for shielding the gate bond pad from the relatively high drain voltage must be utilized. One such shielding means, herein termed a gate shield region, comprises a relatively heavily doped semiconductor region, of opposite conductivity type to the drain region, disposed at the semiconductor wafer surface beneath the gate bond pad and runners.

A typical VDMOS device structure embodies a plurality of double-diffused source/body cells in a two dimensional array at one of the major surfaces of the wafer. The cells are spaced from each other and from the gate shield region. However, we have observed a significant problem to occur in those source/body cells nearest the gate shield region when the device is subjected to certain operating conditions. More specifically, when a condition such as a high rate of change of drain-to-source voltage with respect to time (i.e., a high dV/dt) produces a relatively high junction current across the gate shield region/drain region PN junction, the bias on the shield region may rise to a value which forces some of the current into the neighboring cells. This causes these cells to turn on and ultimately leads to device failure in a second breakdown failure mode. In an effort to overcome this problem, the present invention was discovered.

SUMMARY OF THE INVENTION

A VDMOS device comprises a semiconductor wafer having first and second opposing major surfaces wherein a source region is spaced from a drain region so as to define a channel region in a body region at the first major surface. A source electrode contacts the source region, an insulated gate electrode overlies the channel region, and a gate bond pad overlies a gate shield region. The gate shield region is contiguous with the drain region, is spaced from the channel region, and is of similar conductivity type to the bond region but of relatively high conductivity compared thereto. The invention comprises including a plurality of contact areas along the periphery of the gate shield region and having the source electrode ohmically contact these contact areas.

DETAILED DESCRIPTION OF THE PREFERRED EMBODIMENT

Figure 1:
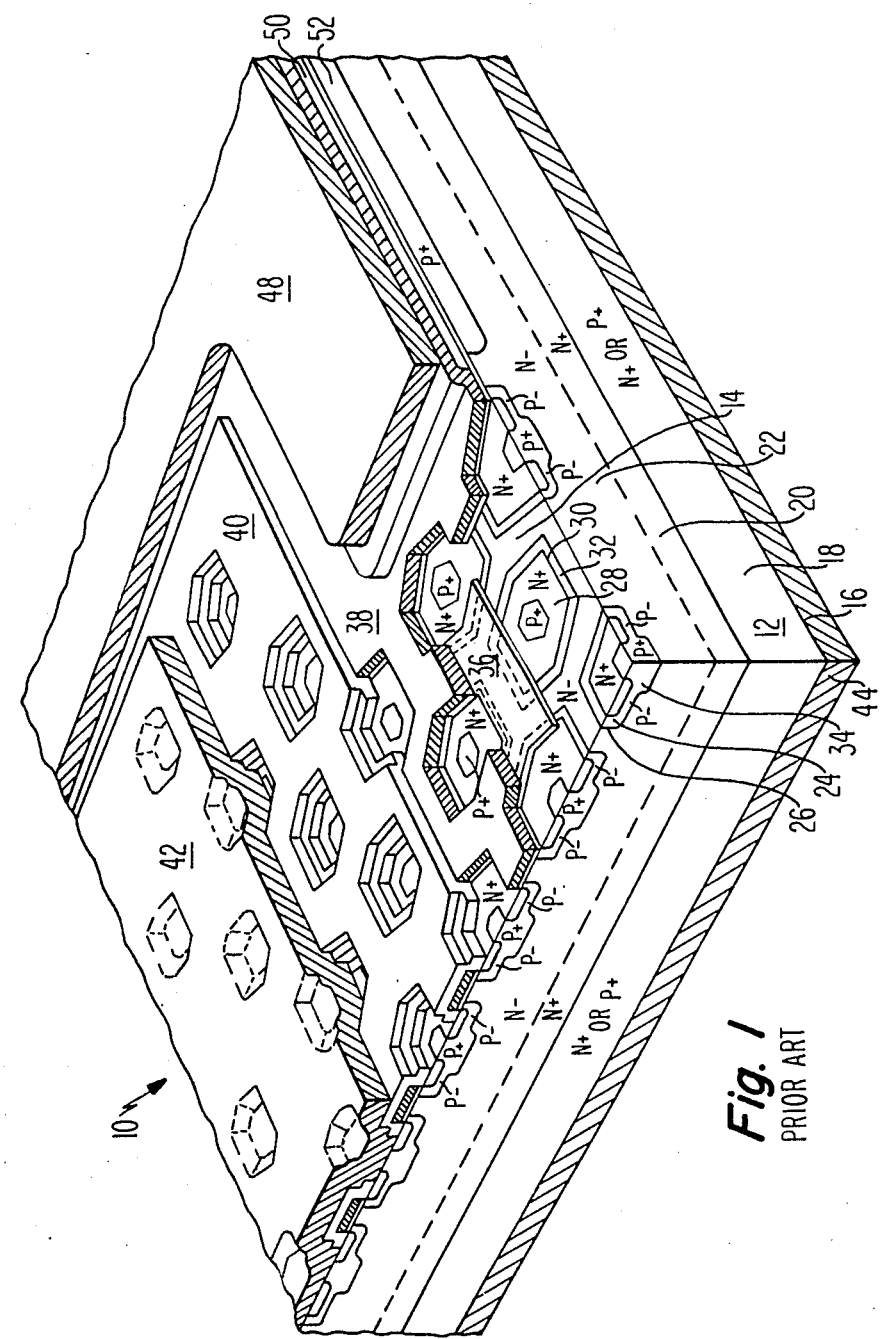
FIG. 1 is a perspective view, in section, of a conventional VDMOS device.

A conventional VDMOS device 10, which may be either a three layer MOSFET or a four layer COMFET, is illustrated in FIG. 1. The device 10 comprises a semiconductor wafer 12 having first and second opposing major surfaces 14 and 16 respectively. Disposed across the second major surface 16 is a relatively high conductivity region 18 of either N+ or P+ type conductivity. In a three layer N channel MOSFET the region 18 is of N+ type material and is referred to as a drain region. In an N channel COMFET the region 18 is of P+ type material and will herein be referred to as an anode region (in a P channel COMFET the region 18 would be of N+ type material and would more properly be referred to as a cathode region). In the N channel COMFET structure an N+ type drain region 20 typically overlies the anode region 18 as shown by the broken line in the illustration. Contiguous with the N+ type drain region 20, or with the relatively high conductivity region 18 when the region 20 is not present, is an N− type extended drain region 22 which extends to the first major surface 14.

Extending into the wafer 12 from the first surface 14 are a plurality of P− type body regions 24, each of which forms a body/drain PN junction 26 at its interface with the N− type extended drain region 22. The body regions 24 are diffused into the wafer from selected portions of the surface 14 such that the body/drain PN junctions 26 intercept the surface 14 in the form of a two dimensional array of hexagons. Extending into the wafer 12 from the first surface 14 within the boundary of each body region 24 is an N+ type source region 28 which forms a source/body PN junction 30 at its interface with its respective body region 24. Each source region 28 and the body region 24 associated therewith is commonly referred to as a source/body cell. Each source/body PN junction 30 is spaced from a respective body/drain PN junction 26 at the surface 14 so as to define the length and width of a channel region 32 in the body region 24 at the first surface 14. The source regions 28 are annular in shape and the outer portions of the source/body PN junctions 30 intercept the surface 14 in the form of hexagons which are concentric with the corresponding body/drain PN junction 26 intercepts. Extending from surface 14 into the central portion of each body region 24, and surrounded by the annular source region 28, is a P+ type supplementary body region 34. The supplementary body regions 34 extend to a depth which is greater than that of the body regions 24.

Disposed on the first surface 14 over the channel regions 32 is an insulated gate electrode which comprises gate insulation 36 on the surface 14 and a gate electrode 38 on the gate insulation 36. The gate insulation 36 is typically comprised of silicon dioxide in the thickness range of approximately 500 to 2,000 angstroms and the gate electrode 38 typically comprises doped polycrystalline silicon. An insulating layer 40, typically comprising a silicate glass such as phosphosilicate glass (PSG), borosilicate glass (BSG) or borophosphosilicate glass (BPSG) overlies the gate electrode 38 so as to electrically isolate the electrode from overlying layers. A source electrode 42 overlies the insulating layer 40 and contacts the first surface 14 so as to contact the source region 28 and supplementary body region 34. A drain electrode 44 contacts the high conductivity region 18 on the second surface 16.

External electrical contact to the gate electrode 38 is made via a gate bond pad 48 which typically comprises metal. The gate bond pad 48 is in direct contact with the gate electrode 38 and overlies an area of the first surface 14 which does not contain source/body cells. That portion of the wafer surface 14 over which the gate bond pad 48 and underlying gate electrode 38 is disposed is insulated therefrom by gate bond pad insulation 50. The gate bond pad insulation 50 typically comprises silicon dioxide in the 10,000 Angstrom thickness range and may further include the gate insulation 36.

Disposed in the semiconductor wafer 12 adjacent to the surface 14 and having a similar geometric shape as and being in registration with the gate bond pad 48, is a gate shield region 52 of P+ type conductivity. The gate sheild region 52 is typically fabricated simultaneously with the supplementary P+ type body regions 34 and therefore extends to a similar depth and has a similar conductivity profile to the supplementary body regions 34.

Figures 2, 3:
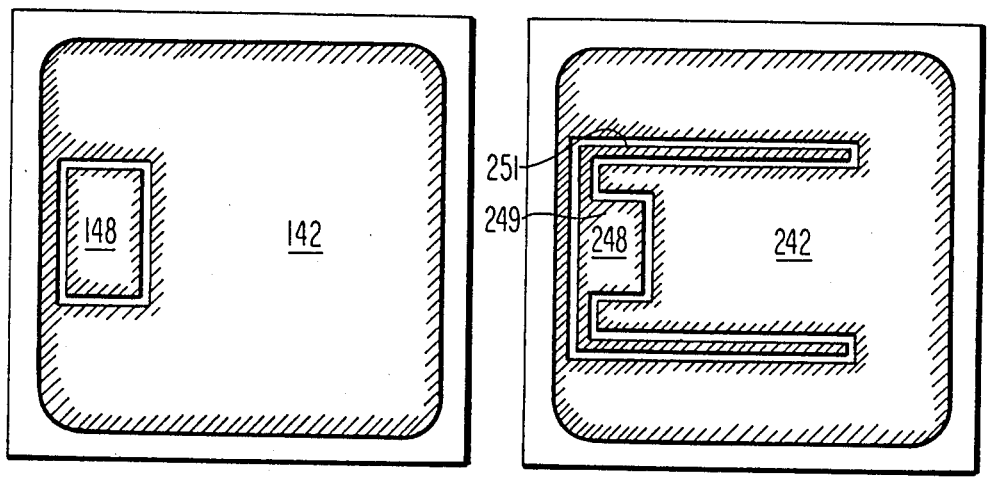
FIGS. 2 and 3 are views of one of the major surfaces of VDMOS device illustrating alternative gate bond pad configurations.

Shown in FIGS. 2 and 3, hereinafter referred to as top views, are alternative conventional configurations of a gate bond pad which are also suitable for devices of the present invention. In FIG. 2 a substantially rectangular gate bond pad 148 is surrounded by and spaced from a source electrode 142. In the embodiment of FIG. 3 the gate bond pad 248 includes a substantially rectangular bonding area portion 249 and a pair of runners 251 in the form of relatively long narrow lines contiguous with the rectangular bonding area portion 249. Again, the gate bond pad 248 is spaced from and surrounded by the source electrode 242 at the first surface. As discussed with reference to the gate bond pad 48 of FIG. 1, a gate bond pad insulator is disposed between the gate bond pads 148 and 248 and the respective surfaces over which they are disposed, and a gate shield region is disposed in the semiconductor wafer in registration with gate bond pads 148 and 248 at the wafer surface.

Figure 4:
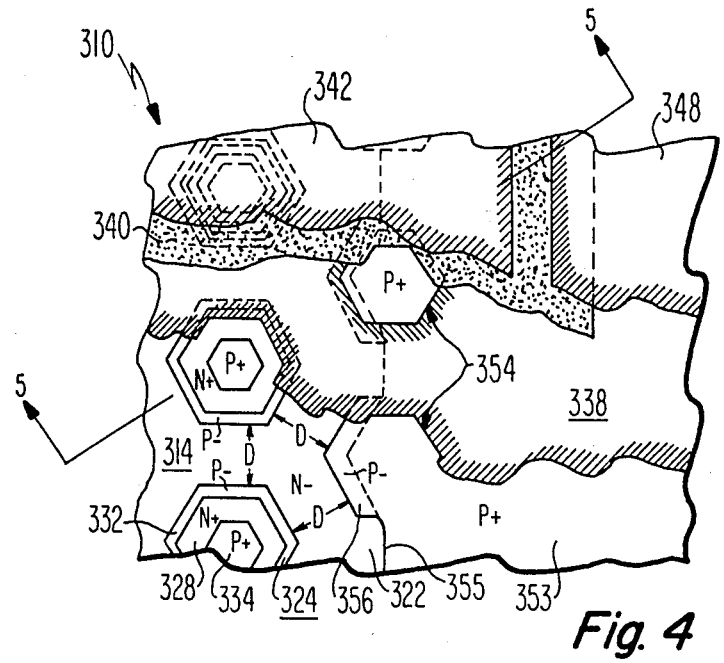
FIG. 4 is a top view, partially in section, of a VDMOS device incorporating the gate shield structure of the present invention.
Figure 5:
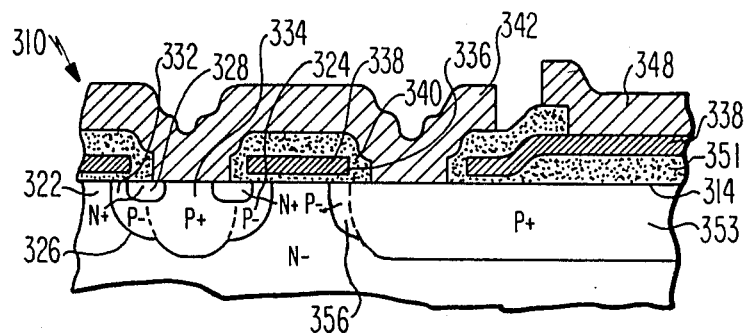
FIG. 5 is a sectional view of the VDMOS device of FIG. 4, further illustrating the gate shield structure of the present invention.

In accordance with the present invention, a unique gate shield structure is utilized which creates an unexpected significant enhancement in certain device operating parameters. The structure is described with reference to FIGS. 4 and 5 wherein FIG. 4 is a top view of a portion of a device 310 incorporating the invention and FIG. 5 is a cross sectional view of the device 310 taken through the portion of the structure illustrated in FIG. 4 as section 5—5. FIG. 4 illustrates a major wafer surface 314 with various overlying layers shown partially in section. For clarity of description, certain reference numbers used to describe features in FIGS. 4 and 5 will be similar to the reference numbers used in FIG. 1, preceded by the numeral 3.

The device 310 includes a plurality of hexagonal source/body cells surrounded by an extended drain region 322. As in the structure of the conventional device 10, the source/body cells each comprise an annular source region 328 surrounded by a body region 324 of opposite conductivity type, so as to define a hexagonal channel region 332 between the source region 328 and the surrounding extended drain region 322 of the surface 314. A supplementary body region 334, of relatively high conductivity, is disposed centrally within each source/body cell, extends more deeply from the surface 314 than the surrounding body region 324 and interconnects each body region 324 with the surface 314. The portion of the device 310 illustrated in FIGS. 4 and 5 shows the gate shield region 353 of the present invention and source/body cells which neighbor the gate shield region 353 and overlying gate bond pad 348.

FIGS. 4 and 5 illustrate a convenient geometry for the gate shield region 353 when the invention is adapted to be used on a VDMOS device incorporating a hexagonal source/body cell structure, such as device 10. As shown, the intercept of the gate shield region 353 at the first surface 314, as identified at 355, is substantially geometrically complementary to the array of hexagonal source/body cells which intercepts the surface 314. In the optimal configuration, the spacing between the gate shield region 353 and the neighboring source/body cells, identified at D in FIG. 4, is equal to the closest spacing between cells. Spacings greater than or less than D will yield less than the maximum improvement possible with the structure of the invention. The process for making such a structure is readily incorporated into the conventional devive fabrication technique as will be elaborated upon herein.

As with the conventional device 10, an insulated gate electrode comprising gate insulation 336 and a gate electrode 338 overlies the channel region 332 of each cell as well as the extended drain region 322 between cells. Thus, as with the device 10, the insulated gate electrode of the device 310 also has the configuration of an apertured sheet. In the device 310 the gate electrode 338 extends over the gate shield region 353 and is insulated therefrom by gate bond pad insulation 351. However, in the device 310 the gate electrode 338 further includes apertures 354 to the gate shield region 353. The presence of these apertures 354, which expose portions of only the gate shield region 353. is critical to the invention. In the preferred embodiment the aperture 354 are disposed proximate to the intercept 355 of the gate shield region 353.

Overlying a portion of the gate electrode 338 is an insulating layer 340 which insulates the gate electrode from overlying layers. The insulating layer 340 includes apertures to the surface 314 at locations corresponding to the apertures 354 in the insulated gate electrode, and an overlying source electrode 342 contacts the surface 314 via these apertures. The source electrode 342, typically comprising a metal such as aluminum, contacts both the source regions 328 and the supplementary body regions 334 through the apertures corresponding to the source/body cells. Additionally, in the structure of the present invention, the source electrode 342 contacts the gate shield region 353 at a plurality of locations via the apertures 354 in the insulated gate electrode and overlying insulating layer.

Overlying the gate electrode 338 so as to form an ohmic contact therewith is a gate bond pad 348. Additionally, as illustrated, the gate bond pad 348 may overlap some portion of the insulating layer 340 which overlies the gate electrode 338. A typical gate bond pad 348 configuration includes a bonding area portion, typically rectangular in shape, to which external connection is made, and one or more runners extending therefrom. The view in FIG. 3 depicts an exemplary configuration. As with the device 10, the gate shield region 353 underlies the entire area of the gate bond pad 348, i.e., it underlies the bonding area portion and any runners associated therewith. However, in the structure of the present invention, the gate shield region 353 additionally extends laterally beyond the gate bond pad 348 so as to provide contact areas for the source electrode 342. When the gate bond pad 348 includes a bonding area portion and runners, favorable results have been observed by forming apertures 354 and source electrode contacts to the gate shield region 353 at locations corresponding to substantially every source/body cell along the periphery of the bonding area portion, and at locations corresponding to every fifth source/body cell along the periphery of the runners. It should be understood, however, that the optimum number and location of apertures 354 must be empirically determined for a particular device geometry.

Devices of the present invention can be fabricated by conventional techniques. For example, by performing relatively minor modifications to the artwork (e.g., photomasks) used in the fabrications of the device 10, a device 310 in accordance with the present invention can be made. The basic fabrication process for VDMOS devices is well-known in the semiconductor art. Essentially, the steps include: providing a relatively heavily doped wafer; epitaxially forming a relatively lightly doped extended drain region layer thereon; masking, introducing and diffusing a dopant for the supplementary body region and gate shield region; forming the apertured insulated gate electrode; sequentially introducing and diffusing the body region dopant and source region dopant; and forming overlying insulating layers and electrodes to both surfaces of the semiconductor wafer.

With reference to FIG. 1, the modifications to the device 10 processing sequence needed to create the device 310 essentially remove the source region 28 from the source/body cells neighboring the gate shield region 52, eliminates the extended drain region 22 which exists between the gate shield region 52 and its neighboring source/body cells, and replaces the eliminated portion of the extended drain region 22 with a continuation of the gate shield region 52.

As shown in FIGS. 4 and 5, the gate shield region 353 includes a plurality of P— type portions 356 along the periphery thereof. The P— type portions 356 are contiguous with the extended drain region 322 and adjacent to those areas of the gate shield region 353 which are contacted by the source electrode. These P— type portions 356 extend to the same depth as the P— type body regions 324 and preferably have a similar conductivity profile thereto, whereas the remainder of the gate shield region 353, i.e., the P+ type portion, extends to a depth similar to that of the P+ type supplementary body regions 334. Thus, the P— type portions 356 are relatively shallow compared to the remainder of the gate shield region 353. During the formation of the source/body cells, when the body region dopant is introduced and diffused, the body region dopant is also introduced through the apertures 354 to the gate shield region 353 and forms the P— type portions 356. These P— type portions 356 are the remnants of what would have been a body and channel region in each of the modified cells.

The presence of the P— type portions 356 presents at least two advantages. Firstly, the technique by which they are fabricated inherently provides optimum registration (i.e., spacings D) with respect to the neighboring source/body cells. Secondly, since the P— type portions 356 are contiguous with the P+ portion of the gate shield region 353, the PN junction between the P— type portions 356 and the adjacent N— extended drain region 322 provides a continuation to the PN junction between the P+ portion of the gate shield region 353 and the extended drain region 322. The relatively shallow PN junctions associated with the P— type portions 356 combined with the relatively deep PN junction associated with the remainder of the gate shield region 353 essentially increases the radius of curvature of the gate shield region 353 in the areas where the P— type portions 356 are located. Thus, for a given bias, the electric field surrounding these portions of the gate shield region/extended drain region PN junction is lower than it would be if the P— type portions 356 were not present.

Devices incorporating the gate shield region 353 of the present invention provide several significant advantages over conventional devices. These advantages are manifested whenever the device 310 is subjected to a condition which produces what will herein be referred to as a junction current, i.e., a fairly uniform current per unit area flowing across the PN junction between the gate shield region 353 and the extended drain region 322 and the body/drain PN junction 326. Examples of conditions which create junction current are: rapidly rising voltage (i.e., a high dV/dt); avalanche breakdown; thermal diffusion; and thermal generation from defects such as heavy metal contaminants, dislocations, and radiation damage. Any current which arises at the gate shield region/drain region PN junction must be carried to the source electrode 342 through a path which has a low enough resistance to keep the gate shield region 353 from rising to a voltage which would cause device damage.

Each of the individual source/body cells has its body region 324 connected to the source electrode 342 via the supplementary body region 334 at the center of the cell. When a junction current exists, current will also flow from the body/drain PN junction 326, through the P— type body region 324 beneath the source region 328, to the source electrode 342, via the the supplementary body region 334. As long as this current is low enough so that the voltage drop through the body region 324 is only a few tenths of a volt there will be no significant multiplication of the current. However, if this voltage drop reaches a value on the order of 0.6 volts or greater, electrons will be injected from the N+ type source region 328 into the body region 324, diffuse across the body region 324, the be collected by the N— type extended drain region 322. This constitutes a turn-on of the parasitic bipolar transistor formed by the source, body and drain regions and produces a second breakdown type of current multiplication and device failure.

Since the area of the body/drain PN junction associated with each source/body cell is typically quite small, individually cells can typically tolerate dV/dt's on the order of $10^5$ volts per microsecond, and will create little or no problem in MOSFET performance. However, in conventional devices, a problem does occur under junction current producing conditions such as high dV/dt in those source/body cells which are located near the gate shield region. Since the area of the gate shield region/extended drain region PN junction in conventional devices (and in devices of the present invention) is typically hundreds of times larger than the area of the body/drain PN junctions associated with the individual cells, a correspondingly high current must be disposed of when there is a high dV/dt or other condition which produces a junction current. In a conventional device, the junction current at the gate shield region/extended drain region PN junction may cause the bias on the gate shield region to rise high enough to force some of the current into the neighboring cells, causing them to turn on and subsequently fail due to breakdown.

In devices of the present invention there is no direct connection between the gate shield region 353 and the parasitic bipolar transistors associated with the neighboring source/body cells. Therefore, the gate shield region 353 must rise to a potential on the order of approximately 10 volts before parasitic turn-on can occur. That is, the potential in the gate shield region 353 must rise high enough so as to bridge the gap D between the gate shield region 353 and the neighboring source/body cells. In devices of the present invention an order of magnitude increase in junction current can be sustained before parasitic turn-on occurs. This provides an improved capability to handle high dV/dt conditions, breakdown energy, temperature, and radiation damage than is provided in a conventional device. In COMFETs the structure of the present invention further provides a higher latching current.

Lastly, it should be noted that although the present invention has been described in terms of N channel MOSFET structures, it is suitable to P channel structures as well. Furthermore, it should be readily apparent that the invention is also suitable to VDMOS devices having other than hexagonal cell structures. Devices with a variety of other channel geometrices, for example, square, grid, interdigitated or meandering, can also incorporate the invention.

What is claimed is:

1. In a VDMOS device comprising a semiconductor wafer having first and second opposing major surfaces, a first conductivity type drain region at the first surface, an array of second conductivity type body regions diffused into the drain region from the first surface and spaced from each other by a distance D, each forming a body/drain PN junction, a relatively high conductivity supplementary body region diffused into each body region from within the boundary thereof at the first surface, a first conductivity type source region diffused into each body region so as to form a source/body PN junction, the spacing between the source/body PN junction and body/drain PN junction defining a channel region at the first surface, a source electrode contacting the source and body regions, an insulated gate electrode overlying the channel region, and a gate bond pad, in direct contact with the gate electrode, overlying a second conductivity type gate shield region and insulated therefrom, the gate shield region being contiguous with the drain region and spaced from the channel regions, the improvement comprising:
   a predetermined number of source/body cells neighboring the gate shield region and being spaced therefrom by distance D;
   the gate shield region including a plurality of contact areas proximate to the periphery thereof;
   the gate bond pad including a bonding area portion and a runner;
   the number of said contact areas which neighbor the bonding area portion being approximately equal to the number of source/body cells which neighbor the bonding area portion;
   the number of said contact area which neighbor the runner being approximately equal to one fifth the number of course/body cells which neighbor the runner, the contact areas which neighbor the runner being substantially uniformly spaced from each other; and
   the source electrode ohmically contacting said contact areas.

2. A device in accordance with claim 1 further comprising an anode region, of opposite conductivity type to said drain region, contiguous with the second major surface so as to form an N channel COMFET.

3. A device in accordance with claim 1 further comprising a cathode region, of opposite conductivity type to said drain region, contiguous with the second major surface so as to form a P channel COMFET.

4. A device in accordance with claim 1 wherein the gate shield region further comprises a plurality of relatively low conductivity portions disposed between said contact areas and the drain region.

5. A device in accordance with claim 4 wherein said relatively low conductivity portions extend to a predetermined depth from the first major surface, said predetermined depth being shallower than the depth of the remainder of the gate shield region.

6. A device in accordance with claim 4 wherein each of said relatively low conductivity portions has a conductivity profile similar to that of said body region.

7. A device in accordance with claim 4 further comprising:
   said gate shield region including a portion having a similar conductivity profile to the relatively high conductivity supplementary body region.

* * * * *